(12) United States Patent
Takei et al.

(10) Patent No.: US 11,348,844 B2
(45) Date of Patent: May 31, 2022

(54) SEMICONDUCTOR WAFER INCLUDING SILICON CARBIDE WAFER AND METHOD FOR MANUFACTURING SILICON CARBIDE SEMICONDUCTOR DEVICE

(71) Applicant: DENSO CORPORATION, Kariya (JP)

(72) Inventors: Shinya Takei, Kariya (JP); Shuhei Mitani, Kariya (JP); Haruhito Ichikawa, Kariya (JP); Ippei Takahashi, Nagakute (JP); Yukihiro Wakasugi, Toyota (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/151,821

(22) Filed: Jan. 19, 2021

(65) Prior Publication Data

US 2021/0143070 A1 May 13, 2021

Related U.S. Application Data

(63) Continuation of application No. PCT/JP2019/028317, filed on Jul. 18, 2019.

(30) Foreign Application Priority Data

Jul. 20, 2018 (JP) .............................. JP2018-136668

(51) Int. Cl.
*H01L 21/02* (2006.01)
*H01L 21/66* (2006.01)
(Continued)

(52) U.S. Cl.
CPC ........ *H01L 22/12* (2013.01); *H01L 21/02378* (2013.01); *H01L 21/02529* (2013.01);
(Continued)

(58) Field of Classification Search
CPC ......... H01L 21/02008; H01L 21/02378; H01L 21/02529; H01L 21/02634; H01L 21/0274; H01L 21/0465; H01L 21/0475; H01L 22/12; H01L 22/20; H01L 29/1095; H01L 29/1608; H01L 29/66068; H01L 29/7813; G03F 7/20; C30B 29/36
See application file for complete search history.

(56) References Cited

U.S. PATENT DOCUMENTS

| | | | | |
|---|---|---|---|---|
| 6,057,170 | A * | 5/2000 | Witte ...................... | G01B 21/30 438/15 |
| 2008/0139089 | A1* | 6/2008 | Aoki .................... | C09K 3/1436 451/37 |

(Continued)

*Primary Examiner* — Eric A. Ward
(74) *Attorney, Agent, or Firm* — Posz Law Group, PLC

(57) ABSTRACT

A semiconductor wafer includes a silicon carbide wafer and an epitaxial layer, which is disposed at a surface of the silicon carbide wafer and made of silicon carbide. The semiconductor wafer satisfies a condition that a waviness value is equal to or smaller than 1 micrometer. The waviness value is a sum of an absolute value of a value α and an absolute value of a value β. A highest height among respective heights of a plurality of points with reference to a surface reference plane within a light exposure area is denoted as the value α. A lowest height among the respective heights of the points at the epitaxial layer with reference to the surface reference plane within the light exposure area is denoted as the value β.

6 Claims, 9 Drawing Sheets

(51) Int. Cl.
*H01L 21/027* (2006.01)
*H01L 21/04* (2006.01)
*H01L 29/66* (2006.01)

(52) U.S. Cl.
CPC .... *H01L 21/02634* (2013.01); *H01L 21/0274* (2013.01); *H01L 21/0465* (2013.01); *H01L 21/0475* (2013.01); *H01L 29/66068* (2013.01)

(56) References Cited

U.S. PATENT DOCUMENTS

| | | |
|---|---|---|
| 2011/0233563 A1 | 9/2011 | Sugai et al. |
| 2014/0117380 A1 | 5/2014 | Loboda et al. |
| 2015/0194319 A1 | 7/2015 | Loboda et al. |

* cited by examiner

SEMICONDUCTOR WAFER INCLUDING SILICON CARBIDE WAFER AND METHOD FOR MANUFACTURING SILICON CARBIDE SEMICONDUCTOR DEVICE

CROSS REFERENCE TO RELATED APPLICATIONS

The present application is a continuation application of International Patent Application No. PCT/JP2019/028317 filed on Jul. 18, 2019, which designated the U.S. and claims the benefit of priority from Japanese Patent Application No. 2018-136668 filed on Jul. 20, 2018. The entire disclosures of all of the above applications are incorporated herein by reference.

TECHNICAL FIELD

The present disclosure relates to a semiconductor wafer and a method of manufacturing a silicon carbide semiconductor device.

BACKGROUND

A semiconductor wafer may include a silicon carbide (SiC) wafer for patterning by using a stepper such as a reduction projection exposure equipment or lithography.

SUMMARY

The present disclosure describes a semiconductor wafer having a SiC wafer and an epitaxial layer disposed at a surface of the silicon carbide wafer, and further describes a method of manufacturing a SiC semiconductor device to form a semiconductor element by adopting the semiconductor wafer.

BRIEF DESCRIPTION OF DRAWINGS

Other objects, features and advantages of the present disclosure will become more apparent from the following detailed description made with reference to the accompanying drawings. In the drawings.

DETAILED DESCRIPTION

Figure 1:
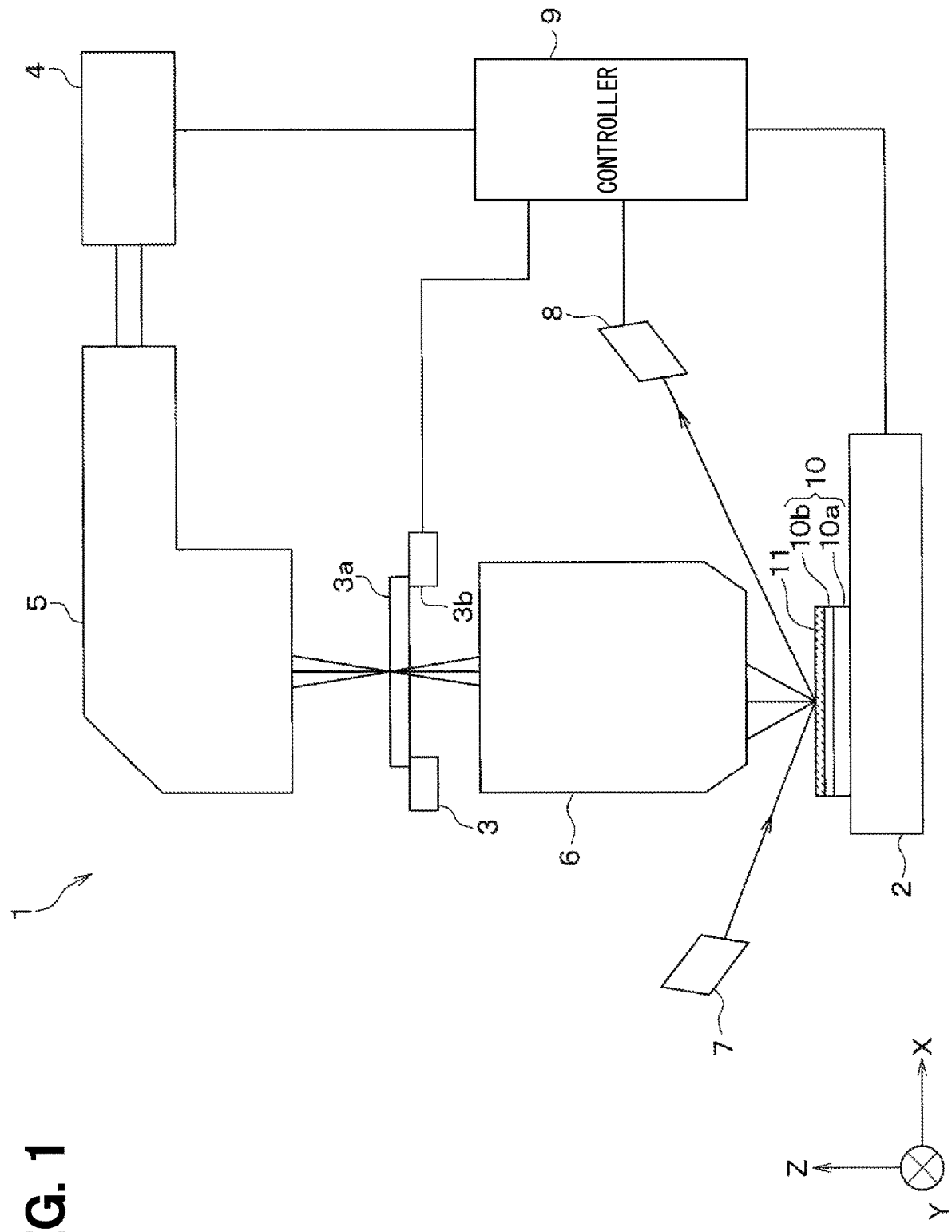
FIG. 1 is a drawing illustrating a schematic configuration of a stepper described in the first embodiment.

A SiC semiconductor device may be manufactured by forming an impurity layer, an insulating film and an electrode on a SiC wafer to form a semiconductor element, and then dividing the wafer into chip units. The patterning of a resist adopted as a photomask for forming the impurity layer, a trench, the insulating film and the electrode may be performed by adopting a stepper. For performing finer patterning of the resist with the stepper, the flatness of the SiC wafer is preliminary evaluated, and the SiC wafer having a finer evaluation is adopted for manufacturing the SiC semiconductor device.

In manufacturing SiC semiconductor devices, the situation of losing shape called defocus may occur at a fixed proportion in a situation where the patterning is performed by adopting the stepper. The focus margin (hereinafter referred to as DOF) may become narrower as the size of the photomask becomes finer, and the defocus occurrence rate may increase particularly in the finer patterning. "DOF" is the abbreviation for "Depth of Focus".

As a result of studies on the cause by the inventors of the present disclosure, the inventors found that the surface shape of the SiC wafer is different from the surface shape of the silicon (hereinafter simply referred to as Si) wafer. The inventors found that "waviness" is present on the surface. The "waviness" on the surface of the SiC wafer occurs, for example, when slicing from a SiC ingot using a wire saw, the wire saw is bent because SiC is a hard material next to diamond.

The stepper performs focus measurement for measuring, for example, the tilt of the wafer surface to obtain a surface reference plane. The stepper performs tilt correction for the surface reference plane of the wafer surface to be perpendicular to an incident direction of irradiation light for exposure. It is possible to suppress the occurrence of defocus, since the light exposure is performed in a state of reducing the height difference in the wafer surface with respect to the surface reference plane.

Even though the surface of the Si wafer is tilted, the surface itself is almost flat. Therefore, it is possible to suppress the occurrence of defocus through the tilt correction. However, in the SiC wafer, since "waviness" exists on the surface, a portion outside the range of the DOF is generated by simply performing the tilt correction, which causes the defocus.

According to a first aspect of the present disclosure, a semiconductor wafer includes a silicon carbide wafer and an epitaxial layer, which is disposed at a surface of the silicon carbide wafer and made of silicon carbide. The semiconductor wafer satisfies a condition that a waviness value is equal to or smaller than 1 micrometer. The waviness value is defined as flatness of a surface of the epitaxial layer acquired by a surface shape measurement device, and the waviness value is a sum of an absolute value of a value α and an absolute value of a value β. The highest height among respective heights of multiple points with reference to a surface reference plane within a light exposure area is denoted as the value α. The lowest height among the respective heights of the multiple points at the epitaxial layer with reference to the surface reference plane within the light exposure area is denoted as the value β. The surface reference plane is acquired by the surface shape measurement device through: a measurement of the respective heights of the points within an evaluation area; and a calculation of a least squares method based on the respective heights. The light exposure area is different from the evaluation area. A center position of the light exposure area is identical to a center position of the evaluation area, and a range of the light exposure area is different from a range of the evaluation area.

According to a second aspect of the present disclosure, a method for manufacturing a silicon carbide semiconductor device includes: preparing a silicon carbide wafer; growing epitaxially an epitaxial layer made of silicon carbide at a surface of the silicon carbide wafer to form a semiconductor wafer; evaluating flatness of a surface of the epitaxial layer with a surface shape measurement device setting an evaluation area and a light exposure area for the surface of the epitaxial layer; and forming a semiconductor element by adopting the semiconductor wafer after evaluating the flatness of the surface of the epitaxial layer. A center position of the light exposure area is identical to a center position of the evaluation area, and a range of the light exposure area is different from a range of the evaluation area. In evaluating the flatness of the surface of the epitaxial layer, the surface shape measurement device measures respective heights of multiple points at the epitaxial layer within the evaluation area, determines a surface reference plane for the epitaxial layer through a calculation of a least-squares method based on the measured respective heights of the multiple points within the evaluation area, and evaluates a waviness value within the light exposure area. The semiconductor wafer is adopted, in a condition that the waviness value is equal to or smaller than 1 micrometer. The waviness value is a sum of an absolute value of a value α and an absolute value of a value β. The highest height among the measured respective heights with reference to the surface reference plane within the light exposure area is denoted as the value α, and the lowest height among the respective heights with reference to the surface reference plane within the light exposure area is denoted as the value β.

According to the first and second aspects of the present disclosure, the semiconductor wafer satisfies the condition of "waviness value"≤1 micrometer (μm). In a situation where such a semiconductor wafer is adopted, in the exposure of the resist formed on the semiconductor wafer, when the tilt is corrected to allow the surface reference plane be perpendicular to the exposure light, "waviness" falls within the range of DOF in the exposure area. Therefore, it is possible to suppress the occurrence of defocus.

The following describes embodiments of the present disclosure with reference to the drawings. In the following embodiments, the same or equivalent parts are denoted by the same reference numerals.

First Embodiment

The following describes a first embodiment. Herein, a method of manufacturing a SiC semiconductor device adopting a stepper will be described.

In a situation of manufacturing a SiC semiconductor device, a stepper is adopted to pattern an exposure mask, and the exposure mask is further adopted to form, for example, a mask for ion implantation, a mask for forming a trench, or a mask for patterning an interlayer insulating film.

The following describes the configuration of a stepper with reference to FIG. 1. The left-right direction illustrated at the drawing of FIG. 1 is described as an X-direction. The direction perpendicular to the drawing of FIG. 1 is described as a Y-direction. The up-down direction illustrated at the drawing of FIG. 1 is described as a Z-direction.

The stepper 1 is used for patterning the resist adopted as a photomask in a situation of manufacturing a mask for ion implantation to an impurity layer, or a mask for patterning an insulating film or an electrode. As shown in FIG. 1, the stepper 1 includes a wafer stage 2, a reticle stage 3, an exposure light source 4, an illumination optical system 5, a projection optical system 6, a light projector 7, a light receiver 8, and a controller 9.

The wafer stage 2 is for a semiconductor wafer 10 as a processed target mounting on the wafer stage 2. The semiconductor wafer 10 has a resist 11 formed on the surface of the semiconductor wafer 10 to be processed. The wafer stage 2 performs position or tilt correction so that the resist 11 is well exposed to light. As an example of the semiconductor wafer 10, a film in which a SiC epitaxial layer (hereinafter simply referred to as an "epilayer") 10b is formed on the surface of a SiC wafer 10a is illustrated. Based on the control signal from the control unit 9, the wafer stage 2 can perform scanning on the XY plane parallel to the X direction and the Y direction, tilt correction of the semiconductor wafer 10, and the like. Therefore, the wafer stage 2 is controlled through the stepper 1 for each shot, that is, for each square range (hereinafter referred to as an light exposure area) exposed by one exposure step to perform alignment and tilt correction of the semiconductor wafer 10.

For the semiconductor wafer 10, a wafer that satisfies the condition of flatness evaluation based on the "waviness value" described hereinafter, that is, the "waviness value" 1 μm is adopted. In particular, in the state after the formation of the epilayer 10b at the surface of the SiC wafer 10a, a wafer that satisfies the condition of "waviness value" 1 μm is adopted as the semiconductor wafer 10. This is for suppressing the defocus of the light exposure of the resist 11 through the stepper 1. The "waviness value" is defined as an evaluation index of flatness for suppressing defocus, when the light exposure of the resist is performed by the stepper 1, for the semiconductor wafer 10 adopting the SiC wafer 10a. This "waviness value" is described hereinafter in detail.

The reticle stage 3 is a support base for a reticle 3a, and is movable in the XY plane. The reticle 3a is a photomask as an original plate for performing pattern transfer by light exposure to the resist 11 to be transferred, and a desired pattern corresponding to the shape to be pattern-transferred to the semiconductor wafer 10 is formed. An opening 3b is formed at the reticle stage 3, and the reticle 3a in which a desired pattern is formed is arranged on the reticle stage 3 so as to straddle the opening 3b. The exposure light emitted from the illumination optical system 5 to the reticle 3a passes through the opening 3b, and is incident on the projection optical system 6.

The exposure light source 4 generates exposure light for exposing the resist 11. The exposure light generated by the exposure light source 4 is transmitted to the illumination optical system 5.

The illumination optical system 5 collects the exposure light transmitted from the exposure light source 4 and irradiates the collected exposure light toward the reticle 3a.

The projection optical system 6 includes, for example, a projection lens. The projection optical system 6 receives the passing light that has passed through the reticle 3a on which the desired pattern is formed, reduces the light to a predetermined ratio through the projection lens, and projects the light onto the resist 11.

Figure 2:
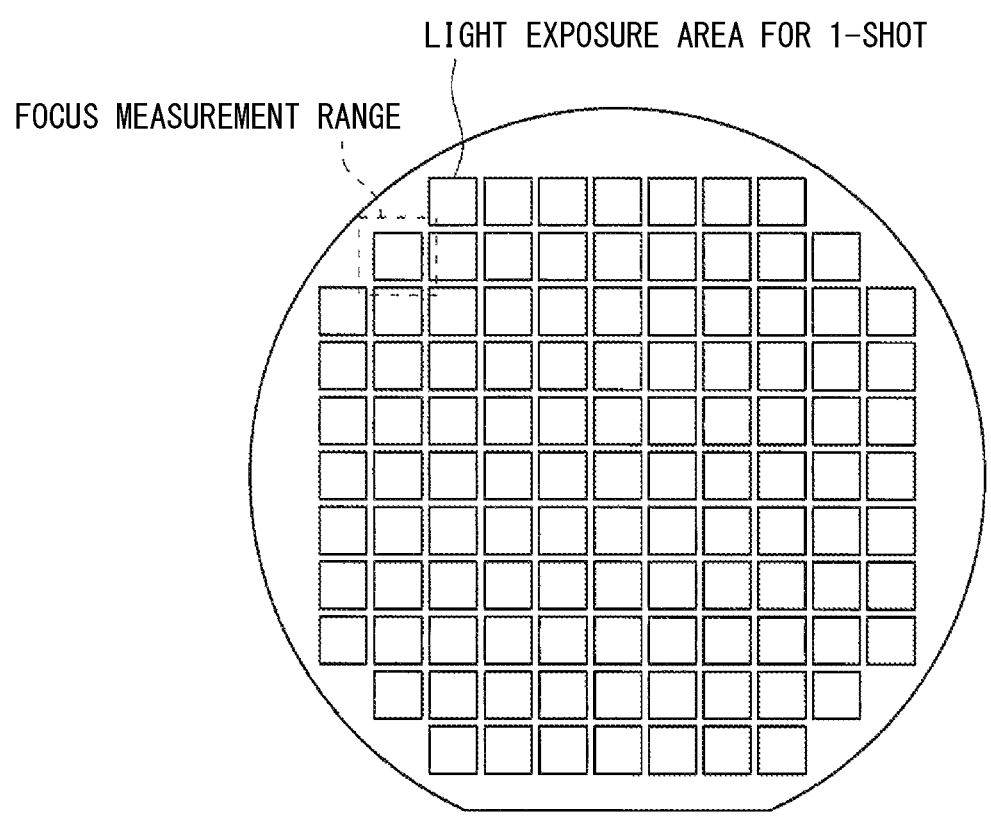
FIG. 2 is a drawing illustrating the relationship between a focus measurement range by the stepper and an exposure area of one shot.

The light projector 7 outputs scan light for focus measurement, and irradiates the scan light within the focus measurement range on the surface of the semiconductor wafer 10. For the stepper 1, the focus measurement range is determined as a fixed area in the specifications. The light projector 7 irradiates scan light for height measurement at multiple points within the focus measurement range, for example, a total of five points at the center position and four corners. In the stepper 1, the "focus measurement range" is a range different from the "light exposure area" of one shot. For example, as illustrated in FIG. 2, the "focus measurement range" has the identical center position as the "light exposure area", and is different in size from the "light exposure area". The "focus measurement range" is set for each "light exposure area", and the step pitches for both are identical. In FIG. 2, the "focus measurement range" is set to the size surrounding the "light exposure area" is illustrated. Herein, the "focus measurement range" is set to 1.4 square centimeters, and the "light exposure area" is set to 1 square centimeter. On the contrary, the "light exposure area" may have a size surrounding the "focus measurement range". Focus measurement is performed in the same number as the number of shots in the effective area adopted as a chip in the semiconductor wafer 10. Here, the range excluding the width of 5 μm, preferably 10 μm from the edge of the semiconductor wafer 10 is set as an effective area, and the portion outside the edge is set as an ineffective area where the chip is not taken out.

The light receiver 8 receives the reflected light of the scan light irradiated to the semiconductor wafer 10 from the light projector 7, and transmits the detection signal indicating the result of light reception to the controller 9.

The controller 9 executes a variety of calculations such as the calculation of the surface reference plane at the focus measurement range and the calculation of the focus height, based on the result of light reception sent from the light receiver 8. The surface reference plane is calculated by the least-squares method based on, for example, the respective heights of the multiple points scanned in the focus measurement range. The controller 9 executes, for example, the control of the reticle stage 3, the control of the wafer stage 2, the control of irradiation of light exposure from the exposure light source 4. Therefore, the movement of the reticle 3a on the XY plane, the movement of the semiconductor wafer 10 as a processed target, the tilt correction based on the focus measurement, and the like are performed.

The resist 11 formed at the surface of the semiconductor wafer 10 with the use of the stepper 1 is exposed to light in a desired pattern. At this time, by using a semiconductor wafer 10 that satisfies the condition of "waviness value" 1 μm, the occurrence of defocus during exposure is suppressed. The following describes details of the "waviness value".

The "waviness value" is a value used as an evaluation index indicating the flatness of the surface of the semiconductor wafer 10 at which the epilayer 10b is formed on the SiC wafer 10a prior to the exposure through the stepper 1. The waviness value is measured by a surface shape measurement device. The following describes the definition of the "waviness value" of the SiC surface in the present embodiment while comparing with the standard of the evaluation index of the flatness of the wafer defined hereinafter.

First of all, "LTV" and "LTIR" are used as evaluation indexes of a wafer's flatness, in other words, the surface shape of the wafer. "LTIR" is an abbreviation for "Local Total Indicated Reading".

"LTV" is a method for evaluating flatness based on the rear surface. The LTV attracts the wafer onto the susceptor of the surface shape measurement device, sets a reference plane parallel to the rear surface. The LTV is a value indicating height difference, as the sum of the absolute values of the respective heights of the highest position and the lowest position of the surface of the wafer with reference to the reference plane in the evaluation area. The evaluation area is a quadrilateral shape selectable by a user, for example, 1.4 square centimeter.

Figure 3A:
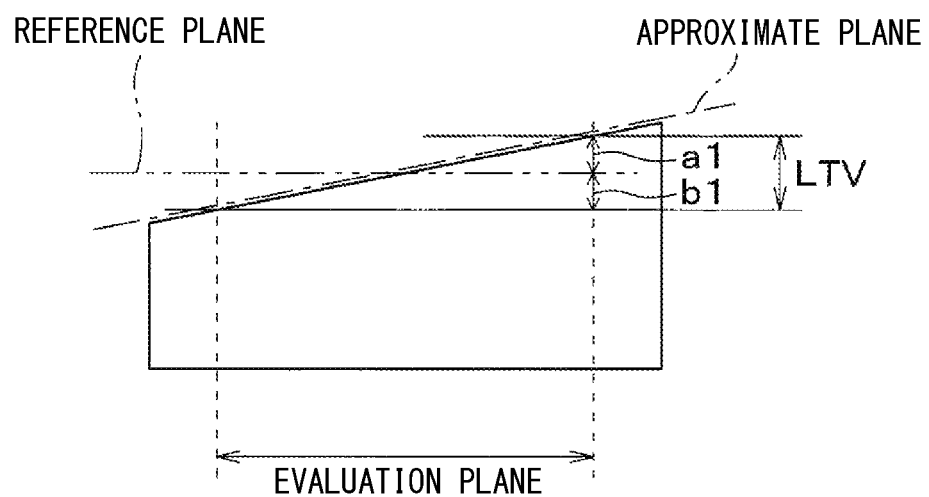
FIG. 3A is a drawing showing a state of LTV (Local Thickness Value) evaluation of a Si wafer.

As illustrated in FIG. 3A, in a case of a Si wafer, the front surface and the rear surface are substantially flat surfaces. In a situation where the front surface is tilted with respect to the rear surface, the sum of the absolute values of the height a1 at the highest position and the height b1 at the lowest position from the reference plane according to the tilt, that is, LTV=|a1|+|b1|. Then, based on the LTV value, the angle at which the tilt correction is performed, in other words, the approximate plane is determined.

Figure 3B:
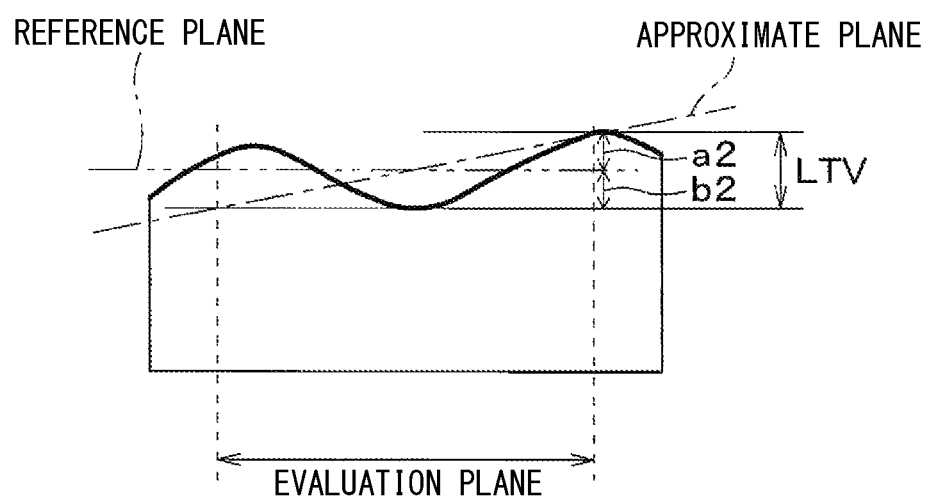
FIG. 3B is a drawing showing a state of LTV evaluation of a SiC wafer.

In other words, as illustrated in FIG. 3B, since the "waviness" is present in the SiC wafer, a variety of heights are present in the evaluation area. Since the LTV is determined only by the height of the highest position and the height of the lowest position, the LTV is determined without taking into account the "waviness" at other positions. In the drawing, the sum of the absolute values of the height a2 at the highest position from the reference plane and the height b2 at the lowest position from the reference plane according to the tilt, that is, LTV=|a2|+|b2|.

Even though the surface is a flat surface whose front surface is tilted with respect to the rear surface as illustrated in FIG. 3A, or even though a surface having "waviness" such as a SiC wafer as illustrated in FIG. 3B, LTV may be identical. In such a situation, LW is acquired by the identical method when performing focus measurement at a time of performing light exposure through the stepper, the tilt correction is performed by moving the wafer stage based on the LTV. Therefore, the approximate plane is perpendicular to the incident direction of the irradiation light for light exposure. If the LTV is identical, the identical tilt correction is performed in both of the situation in FIG. 3A and the situation in FIG. 3B. For this reason, for a SiC wafer actually having "waviness", the tilt correction does not take into account the influence of the "waviness".

In particular, with the SiC wafer, the influence of "waviness" also exists at the rear surface side. In a situation where the SiC wafer is absorbed on the wafer stage, the "waviness" at the rear surface is absorbed so as to shrink. Therefore, the influence also appears at the front surface side. Therefore, the influence of "waviness" may be larger.

Figure 4:
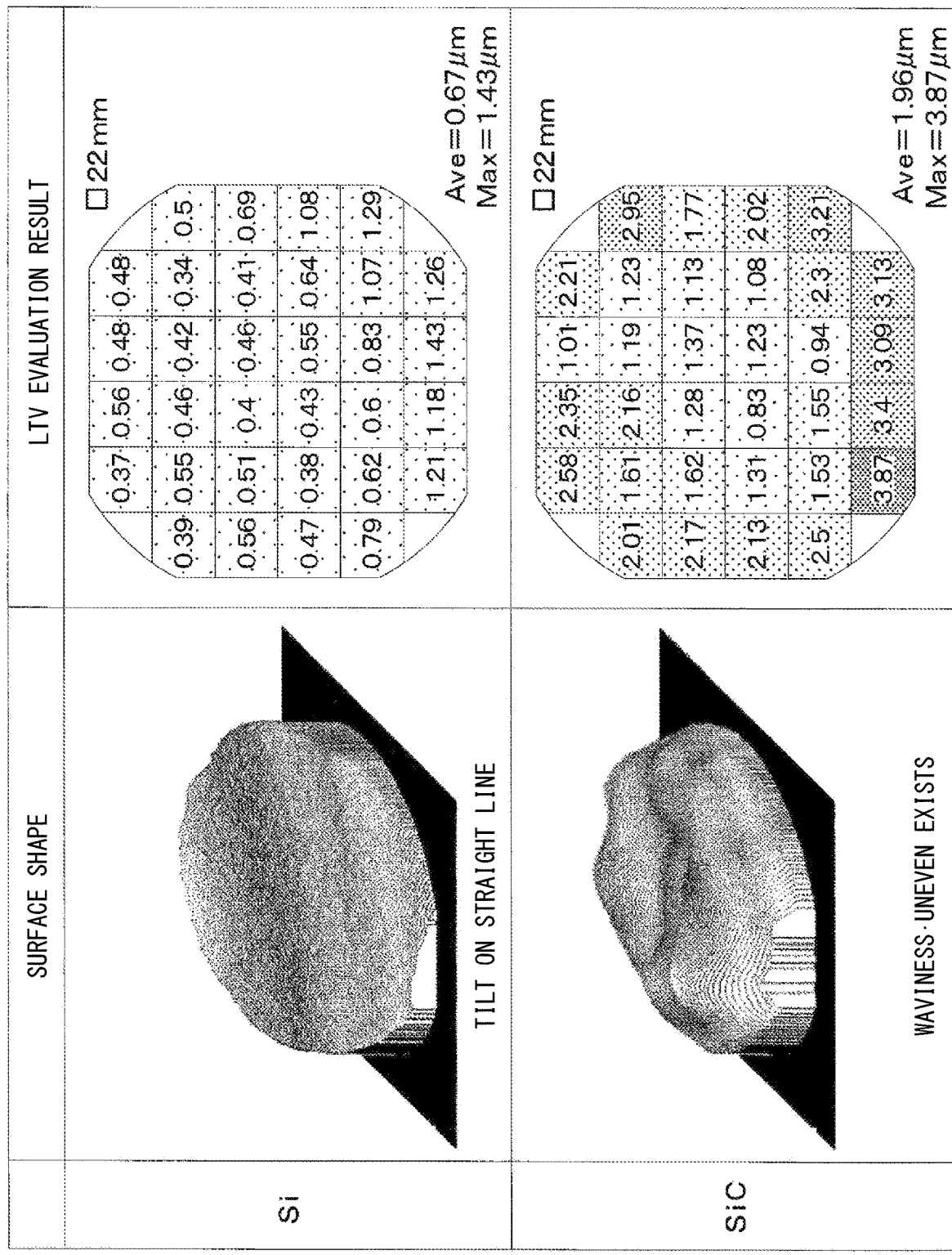
FIG. 4 is a chart illustrating respective surface shapes of Si wafers and SiC wafers and results of the LTV evaluation.

In a situation where the state of the wafer when the epilayer was formed on each of the Si wafer and the SiC wafer, the results shown in FIG. 4 were obtained by measuring the in-plane distribution of the LTV.

As illustrated in this drawing, the surface of the Si wafer is relatively flat even after the epilayer is formed. In addition, the in-plane distribution of LTV tended to be constant. In a situation where the tilt correction is performed when performing light exposure with the stepper and the approximate plane is perpendicular to the incident direction of the irradiation light for light exposure, the height difference at the surface is smaller and the defocus almost does not occur.

On the other hand, in the SiC wafer, a large "waviness" was generated on the surface after the epilayer was formed. It is considered that the above situation is caused by the "waviness" that occurs when the SiC wafer is cut out from the SiC ingot.

The "waviness" on the surface of the SiC wafer occurs, for example, when slicing from a SiC ingot using a wire saw, the wire saw is bent because SiC is a hard material next to diamond. Therefore, in order to reduce the "waviness", flattening such as CMP (chemical mechanical polishing) is performed.

However, when the SiC wafer is flattened, the flattening is performed in a situation where a large stress is applied. Therefore, the residual stress is released and the "waviness" occurs in the heat treatment at the formation of the epilayer. On the other hand, in the SiC wafer, a large "waviness" is generated on the surface after the epilayer is formed. The surface shape measurement device evaluates the respective surface shapes, in a state where the SiC wafer is absorbed on the susceptor, and in a situation where the SiC wafer is absorbed on the wafer stage in the stepper. The influence of the height difference due to "waviness" at the rear surface of the SiC wafer also appears on the front surface of the wafer. The "waviness" at the front surface side appears to be larger.

Figure 5A:
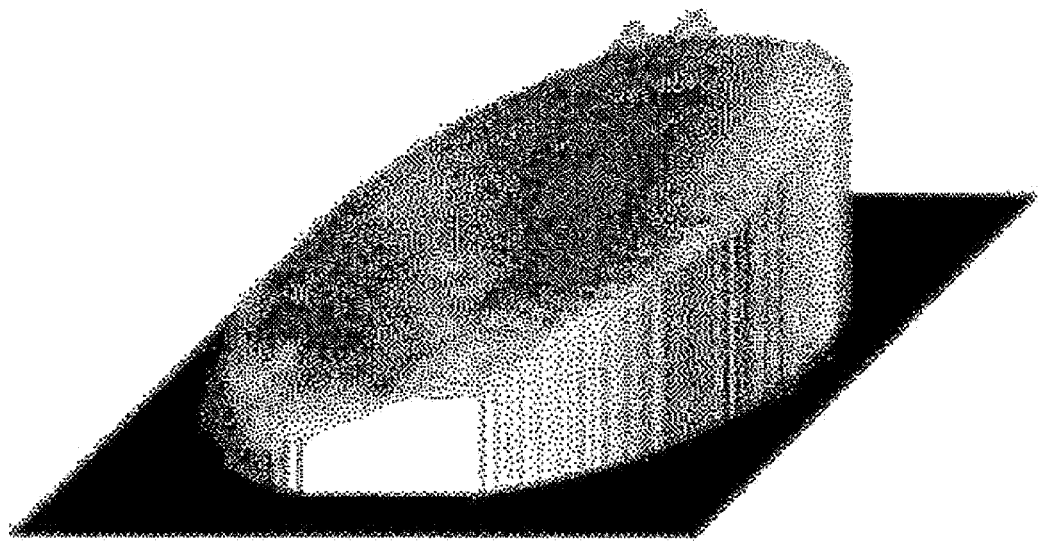
FIG. 5A is a drawing illustrating a state of the SiC wafer before the formation of an epitaxial layer.
Figure 5B:
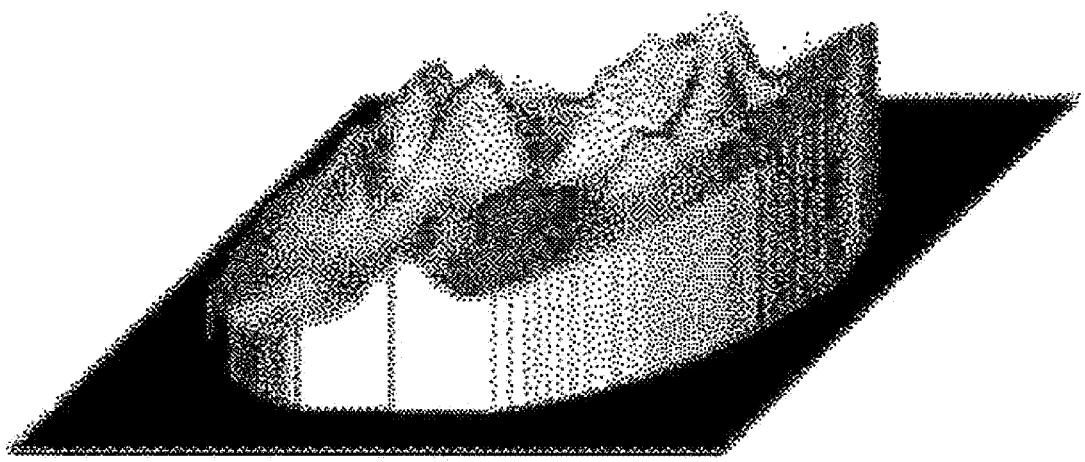
FIG. 5B is a drawing illustrating a state of the SiC wafer before the formation of an epilayer.

As illustrated in FIG. 5A, when the epilayer is formed on the SiC wafer whose surface shape is generally flat before the formation of the epilayer, larger "waviness" appears at the front surface of the epilayer as shown in FIG. 5B. FIGS. 5A and 5B illustrate a state when the surface shape is investigated with the rear surface absorbed on the susceptor of the surface shape measurement device.

Thus, in the SiC wafer, a large "waviness" is generated on the surface after the epilayer is formed. Therefore, even though the tilt is corrected when the exposure is performed with the stepper so that the approximate plane is perpendicular to the incident direction of the irradiation light for light exposure, the height difference from the approximate plane becomes larger, and the part outside the range of DOF is generated and causes defocus. Therefore, when manufacturing a SiC semiconductor device using a SiC wafer, even if an evaluation using LTV as an evaluation index of flatness is performed, precise element formation cannot be performed.

Figure 6:
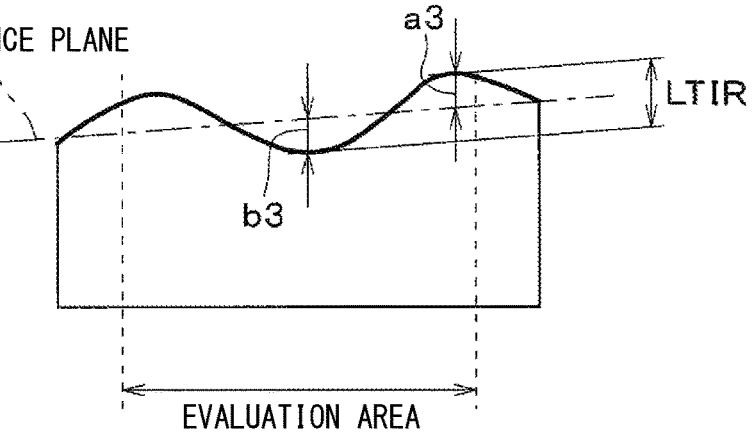
FIG. 6 is a drawing illustrating LTIR.

"LTIR" is a method for evaluating flatness with a predetermined surface reference plane as a reference, and is SFQR. "SFQR" is an abbreviation for "site front least squares range". As illustrated in FIG. 6, the LTIR is the sum of the height a3 at the highest position and the height b3 at the lowest position from the surface reference plane in the evaluation area with reference to the surface reference plane obtained for each evaluation area. In other words, LTIR=|a3|+|b3| is expressed.

The surface shape measurement device measures the surface height at a large number of points, for example, several thousand points in the evaluation area, and obtains a surface reference plane by the least squares method. Since such an evaluation method is used, in LTIR, the flatness can be evaluated in consideration of the "waviness" of the surface of SiC.

In the surface shape measurement device, the evaluation area when evaluating the LTIR may be adjusted by the user, and may be set as, for example, 2.0 square centimeter or 2.4 square centimeter. On the other hand, in the stepper, the focus measurement range and the light exposure area of one shot do not match due to the specifications. Therefore, the surface shape measurement device sets either the focus measurement range or the light exposure area as the evaluation area, and evaluates the flatness by LTIR.

The light exposure area is determined by the specifications of the stepper such as one chip or four adjacent chips arranged in a quadrangular shape, and is a fixed area having, for example, 0.5 square centimeter. The focus measurement range is also a fixed area determined by the stepper specifications. The fixed area is, for example, 1.4 square centimeter.

Since the DOF is related to the range actually exposed, it is considered that the height difference of the surface of the SiC in the light exposure area may be within the range of the DOF. However, in a situation where the light exposure area is set as the evaluation area at the surface shape measurement device, even though the LTIR value is within the DOF range in the light exposure area, it is determined that the defocus occurs at a certain rate when having light exposure at the stepper. This situation is described with reference to FIGS. 7A and 7B.

For example, the focus measurement range is 1.4 square centimeter, and the light exposure area is 0.5 square centimeter. In this situation, the surface shape of the SiC wafer or the like is shown in, for example, FIGS. 7A and 7B.

Figure 7A:
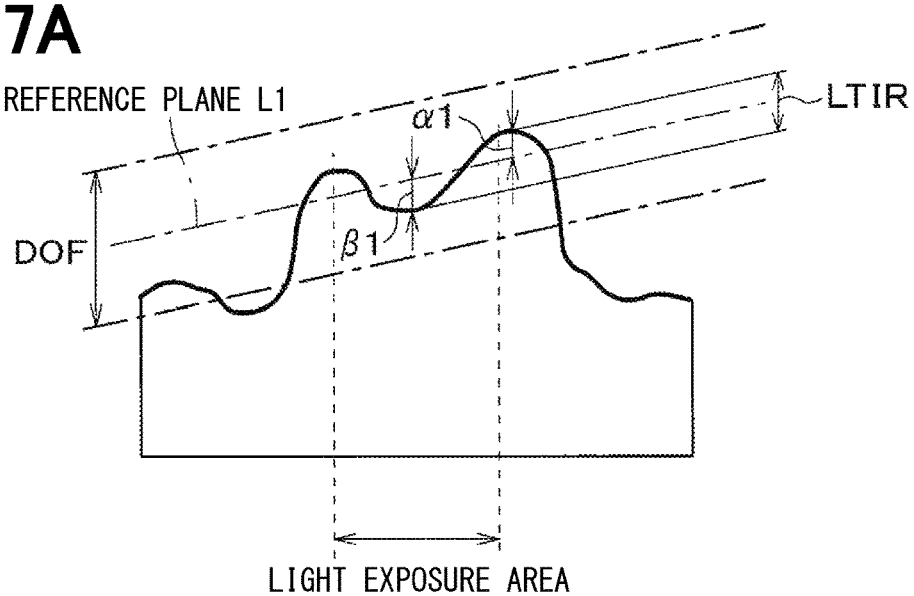
FIG. 7A is a diagram illustrating LTIR when an exposure area is adopted as an evaluation area.

In the surface shape measurement device, the surface reference plane is acquired by measuring the surface height at, for example, several thousand points in the entire evaluation area, and the height difference between the highest position and the lowest position in the evaluation area is acquired. In this situation, as shown in FIG. 7A, in a situation where the evaluation area is set to 0.5 square centimeter according to the light exposure area, the standard reference plane becomes a straight line L1. Since the LTIR is the height difference between the height $\alpha 1$ at the highest position and the height $\beta 1$ at the lowest position, LTIR=$|\alpha 1|+|\beta 1|$. In the case of this example, the LTIR in the light exposure area is within the range of DOF.

Since the LTIR evaluated by the surface shape measurement device was within the DOF range, the focus measurement range becomes 1.4 square centimeter in a situation of having the light exposure through the stepper with the use of the SiC wafer. In the stepper, the standard reference plane is determined and the focus position, that is, the focus height is determined by the identical method as that used by the surface shape measurement device to determine the surface reference plane at the time of focus measurement. For example, in the case of the stepper, height measurement is performed at five points at the center position and four corners of the focus measurement range, and the surface reference plane is set based on these measurements and then the focus height is determined.

Figure 7B:
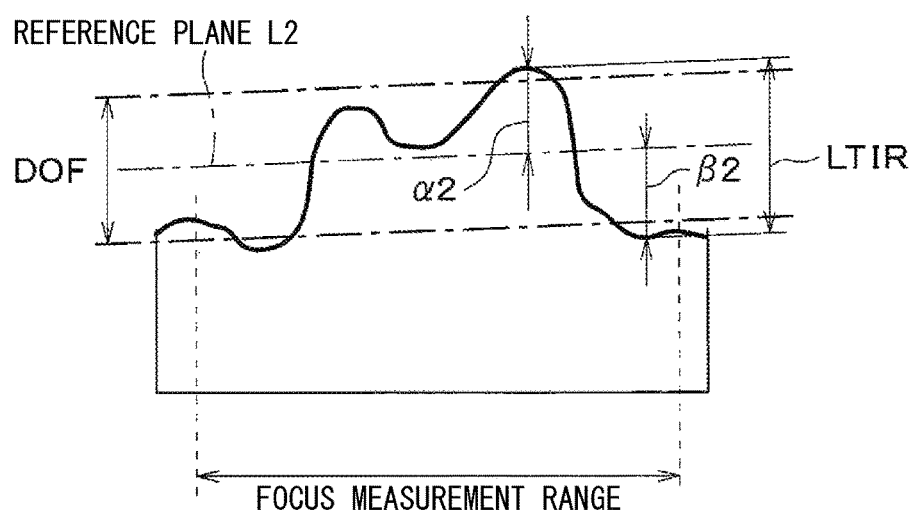
FIG. 7B is a diagram illustrating LTIR when a focus measurement area is adopted as an evaluation area.

The surface reference plane determined by the focus measurement with the stepper is the straight line L2 in FIG. 7B. In a situation of considering the focus measurement range with the stepper, the height difference between the height $\alpha 2$ at the highest position and the height $\beta 2$ at the lowest position from the surface reference plane in the focus measurement range is equivalent to LTIR=$|\alpha 2|+|\beta 2|$. Even though LTIR=$|\alpha 1|+|\beta 1|$ was evaluated by the surface shape measurement device, as a result, the stepper is exposed to the SiC wafer having LTIR=$|a2|+|\beta 2|$. Therefore, in the light exposure area, a portion outside the range of DOF with respect to the focus height with reference to the surface reference plane set in the focus measurement range is generated. Thus, the defocus is generated.

As an evaluation index of flatness in the surface shape measurement device, it is necessary to specify the evaluation index corresponding to the focus measurement range in the stepper instead of LTIR. The concept of "waviness value" was defined as the new evaluation index.

The "waviness value" is defined as the height difference between the height at the highest position and the height at the lowest position with respect to the surface reference plane whose focus measurement range is determined as the evaluation area. The method of determining the surface reference plane is identical to LTIR. The height of the surface of the SiC wafer is measured at a large number of points, for example, several thousand points in the evaluation area, and the calculation is based on the height of each point by the least-squares method to evaluate the surface reference plane.

Figure 8:
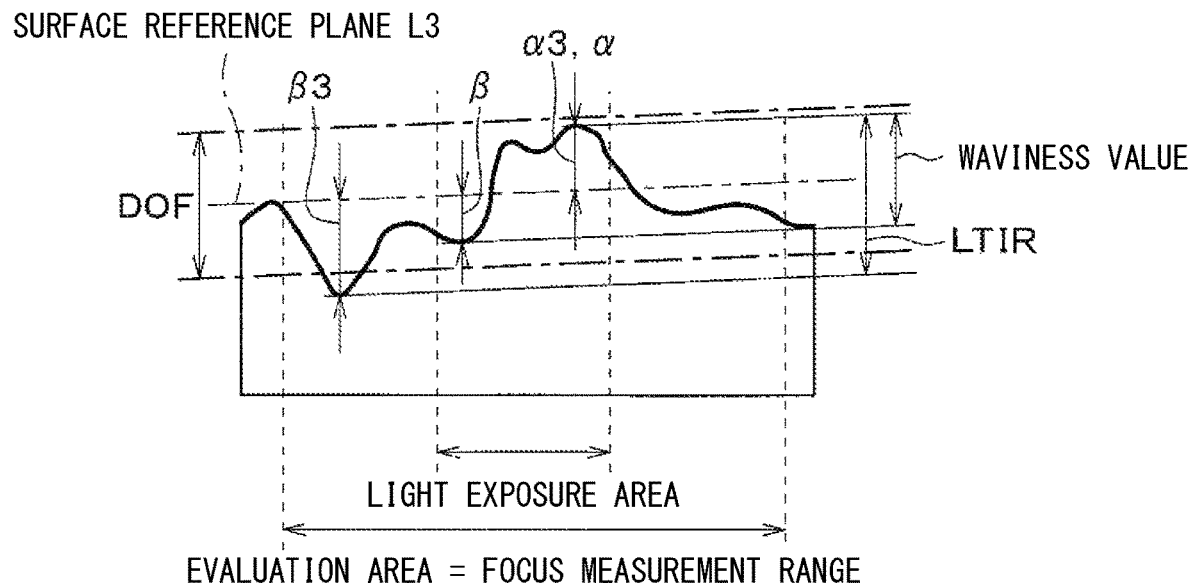
FIG. 8 is a drawing illustrating a "waviness value" in comparison with LTIR.

For example, as shown in FIG. 8, it is assumed that the focus measurement range is set as the evaluation area and the surface reference plane determined in the evaluation area is a straight line L3. In this situation, in the case of LTIR, LTIR=|α3|+|β3|. The height α3 is at the highest position and the height β3 is at the lowest position in the evaluation area. On the other hand, in the case of the "waviness value", the height α of the highest position and the height β of the lowest position in the light exposure area different from the evaluation area are the "waviness value".

By defining such a "waviness value", it is possible to acquire a SiC wafer having a flatness corresponding to the DOF in the focus measurement range of the stepper. In particular, since the DOF in the stepper has a height of ±0.5 µm with reference to the surface reference plane, the desired flatness is satisfied in a situation of "waviness value" 1 µm.

By using the SiC wafer whose flatness is defined as described above, it is possible to prevent defocus from occurring during exposure with a stepper. The focus measurement is performed when exposure is performed with the stepper. The tilt correction is performed so that the surface reference plane is perpendicular to the incident direction of the irradiation light for exposure, and the exposure is performed. The interior of the light exposure area has a flatness corresponding to the DOF, and the magnitude of the "waviness", that is, the height difference between the highest position and the lowest position in the light exposure area is smaller than that of the DOF. Therefore, it is possible to prevent defocus from occurring.

The following describes steps of forming an exposure mask by using the stepper 1.

First, a step of manufacturing the semiconductor wafer 10 satisfying the condition of "waviness value"≤1 µm is performed. The semiconductor wafer 10 to be processed has an epilayer 10b formed on at least a SiC wafer 10a. Here, a case where an exposure mask is formed by exposing the resist 11 with the stepper 1 in order to form a trench with respect to the epi layer 10b, for example, will be described. It may be the case of forming an exposure mask for the purpose.

For preparing the semiconductor wafer 10 satisfying the condition of "waviness value"≤1 µm, it is required that the "waviness" of the SiC wafer 10a is smaller and the "waviness" after the formation of the epilayer 10b is smaller.

As described above, with regard to the SiC wafer 10a, in a situation where the SiC ingot using a wire saw is sliced, the "waviness" occurs due to, for example, the occurrence of bending of the wire saw as the SiC is made of a hard material. A "waviness" of 30 to 50 µm is generated as a height difference between the highest position and the lowest position on the entire surface of the SiC wafer 10a. Therefore, the SiC wafer 10a after slicing is wrapped, ground, or the like to reduce "waviness" on the entire surface of the SiC wafer 10a. However, even if wrapping, grinding, or the like is performed, a damaged layer called a work-affected layer, that is, a layer in which crystal distortion occurs is formed on the front and rear surfaces of the SiC wafer 10a. Since the work-affected layer contributes to the cause of "waviness" occurred after the formation of the epilayer 10b, the wrapping and grinding are controlled so that the work-affected layer is as thin as possible, for example, a thickness of 5 µm or less. After that, a flattening treatment is performed in order to reduce or preferably eliminate the work-affected layer.

In particular, the front and rear surfaces of the SiC wafer 10a are flattened. The flattening process may be performed only on the front surface of the SiC wafer 10a. However, since the "waviness" also affects the rear surface side, the flattening process is also performed at the rear surface side.

The flattening process is performed by CMP. For example, a high-speed CMP capable of performing relatively coarse flatting is initially performed as a first flatting process, and then a finishing step through a low-speed CMP capable of performing finer flattening than the first flatting process is performed.

High-speed CMP is performed by using, for example, potassium permanganate, and the processing speed is 1.0 µm/hr to 5.0 µm/hr. Herein, the processing speed is 2.0 µm/hr. Since the thickness of the processed layer is 5 µm or less, the thickness of 5 µm is removed from each of the front and rear surfaces of the SiC wafer 10a by high-speed CMP.

The low-speed CMP is a CMP in which the removal speed of SiC is slower than that of the high-speed CMP, and is performed to reduce or preferably eliminate the work-affected layer generated by the high-speed CMP. Although the high-speed CMP described above can reduce the work-affected layer, the work-affected layer remains to some extend because the flatting is relatively rough. Alternatively, it is possible to form the work-affected layer through the high-speed CMP. This work-affected layer is reduced or eliminated by low-speed CMP. The low-speed CMP is performed using, for example, colloidal silica, and the processing speed is 0.05 µm/hr to 1.0 µm/hr. Since the thickness of the remaining work-affected layer after performing the high-speed CMP is about 1 µm or less, the thickness of 1 µm is removed from each of the front and rear surfaces of the SiC wafer 10a by low-speed CMP. As a result, the work-affected layer is reduced to a thickness of 0.1 µm or less, and can be preferably eliminated.

After performing a relatively coarse flattening process as the first flattening process, a finer flatting than the first flattening process is performed as the second flattening process. It is possible to remove the damaged later faster by the first flattening process, and flatten the front and rear surfaces by the second flattening process. It is possible to accurately flatten the front and rear surfaces of the SiC wafer 10a while increasing the throughput.

Subsequently, the epilayer 10b is epitaxially grown at the SiC wafer 10a whose front and rear surfaces have been flattened by using, for example, a CVD (chemical vapor deposition) device.

Since the front and rear surfaces of the SiC wafer 10a are flattened, the front and rear surfaces of the SiC wafer 10a are flat surfaces. Since SiC is a hard material, even in the flattening treatment, a large pressure is applied. In the subsequent process involving the heat treatment, the residual stress in the SiC wafer 10a is released when the temperature rises and then the "waviness" occurs. In the semiconductor device manufacturing process with the use of the SiC wafer 10a, an epitaxial growth step is initially performed as a step involves heat treatment. In a situation of forming the epilayer 10b at the surface of the SiC wafer 10a, the residual stress is released based on the high temperature during epitaxial growth, and the surface of the epilayer 10b generates "waviness" in the state after the residual stress is released.

In this state, if the condition of "waviness value"≤1 μm is satisfied, the exposure mask is formed with respect to the base surface derived from the "waviness value" even though the exposure mask is subsequently formed using the stepper 1.

Subsequently, the "waviness value" of the semiconductor wafer 10 after the formation of the epilayer 10b at the surface of the SiC wafer 10a is measured. The "waviness value" is measured using a surface shape measurement device.

Figure 9:
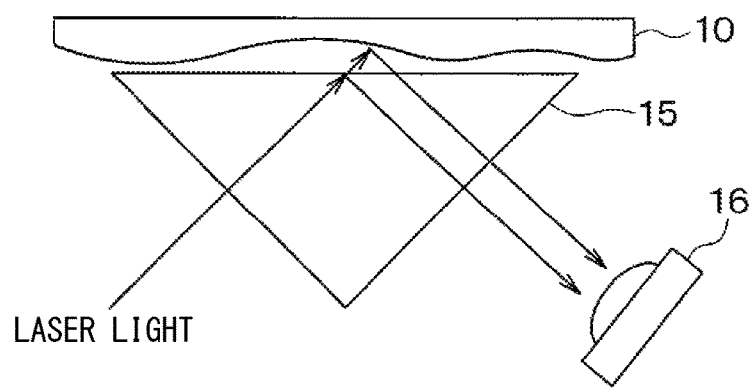
FIG. 9 is a drawing illustrating a state of measurement of the height of the surface through a Fizeau interferometer.

For example, a Fizeau interferometer is adopted as the surface shape measurement device. As illustrated in FIG. 9, the Fizeau interferometer has a prism 15 disposed from the surface of a measurement target with a predetermined spacing. The Fizeau interferometer measures the surface height based on the interference light at a time of irradiating semiconductor laser light from a light source to the surface of the measurement target through the prism 15. The interference light is output from a side of the prism 15 where the semiconductor laser light is received and a side different from the side where the measurement target is oppositely disposed. Therefore, a light receiver 16, for example, a CCD camera is disposed at this position for measurement.

Since the evaluation area may be arbitrarily adjusted in the surface shape measurement device, the evaluation area is set to the same range as the focus measurement range of the stepper 1. Herein, the evaluation area is 1.4 square centimeter. The surface height of the semiconductor wafer 10 as a measurement target at a large number of points, for example, several thousand points in the evaluation area is measured. Hereinafter, this measurement is referred to as an evaluation area height measurement. The surface reference plane is acquired based on the computation of the least-squares method based on the height at each point.

The surface height of the semiconductor wafer 10 as a measured target is measured at respective positions of a large number of points, for example, several thousand points in the light exposure area of one-shot through the stepper 1. Hereinafter, this measurement is referred to as a light exposure area height measurement. The light exposure area is set to 1 square centimeter. With regard to the light exposure area height measurement, the data of the height at points in the light exposure area among the points measured by the evaluation area height measurement may be adopted. However, the evaluation area of the surface shape measurement device may be set to the same range as the light exposure area, and then re-measurement of the height is performed. Further, the "waviness value" is acquired based on the acquired surface reference plane according to the evaluation area height measurement and the height of each point in the light exposure area obtained by the light exposure area height measurement.

Such a "waviness value" is measured for each shot over a range of the semiconductor wafer 10 to be exposed later, that is, the entire effective area utilized as a chip.

Since the epilayer 10b is formed at the surface of the SiC wafer 10a having been flattened as described above, the degree of "waviness" is smaller even though the "waviness" occurs through a high temperature during epitaxial growth. Therefore, it is possible to manufacture the semiconductor wafer 10 satisfying the condition of "waviness value"≤1 μm.

The condition of "waviness value"≤1 μm may not be necessary to be satisfied in the entire wafer surface, but may be satisfied within the effective area. For example, the effective area is the inner region of the semiconductor wafer 10 excluding the ineffective area. Since the ineffective area has a width of 5 μm or more from the outer edge of the semiconductor wafer 10, for example, 10 μm, the inner side of the semiconductor wafer 10 as viewed from the ineffective area is regarded as the effective area. The condition of "waviness value"≤1 μm may be satisfied in this effective area. The ineffective area tends to be largely affected by the "waviness" as compared with the effective area even though the ineffective area is flattened. However, the ineffective area is not the area adopted as a chip and does not have to meet the condition of "waviness value"≤1 μm. Further, it is not necessary to satisfy the condition of "waviness value"≤1 μm in the entire effective area. For example, in a situation where 90% or more of the total number of chips taken out from the effective area satisfies the condition of "waviness value"≤1 μm, quality products can be manufactured with a higher yield.

The resist 11 is formed on the epilayer 10b of the semiconductor wafer 10 satisfying the condition of "waviness value"≤1 μm, and then is disposed on the wafer stage 2 in the stepper 1.

In order to perform focus measurement in the stepper 1, scan light is output from the light projector 7, and the light receiver 8 receives the reflected light reflected at the surface of the semiconductor wafer 10, and then the detected signal indicating the light reception result is sent to the controller 9. As a result, the controller 9 measures the respective heights of multiple points in the focus measurement range, calculates the surface reference plane or focus height, and acquires the result of the focus measurement. Based on the result, the controller 9 executes, for example, the control of the reticle stage 3, the control of the wafer stage 2, the control of irradiation of light exposure from the exposure light source 4. That is, the reticle 3a is moved on the XY plane, the semiconductor wafer 10 is moved on the XY plane, and the tilt is corrected. The exposure light is irradiated, and the resist 11 is exposed to a desired pattern.

The resist 11 is exposed to the light by adopting the semiconductor wafer 10 satisfying the condition of "waviness value"≤1 μm. In a situation where the tilt is corrected so that the surface reference plane is perpendicular to the exposure light, the "waviness" falls within the range of the DOF in the light exposure area. Therefore, it is possible to suppress the occurrence of defocus.

Figure 10:
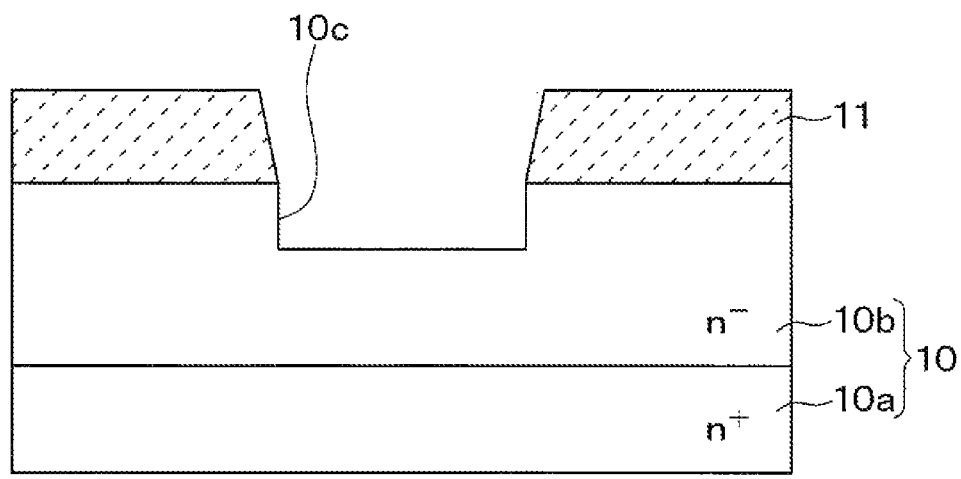
FIG. 10 is a cross-sectional view illustrating a state when a trench is formed by adopting a resist exposed by a stepper as an exposure mask.

Subsequently, the semiconductor element is formed by performing a variety of processes such as forming a trench 10c at the epilayer 10b as illustrated in, for example, FIG. 10, by adopting the resist 11 with the desirable pattern as the mask. In a variety of the processes, the light exposure with the use of the stepper 1 is performed, in a situation of using a light exposure mask such as a mask for ion implantation or a mask for patterning an interlayer insulating film. At this time, since the semiconductor wafer 10 satisfying the condition of "waviness value"≤1 μm is used, the occurrence of defocus is suppressed in any of the processes.

Figure 11:
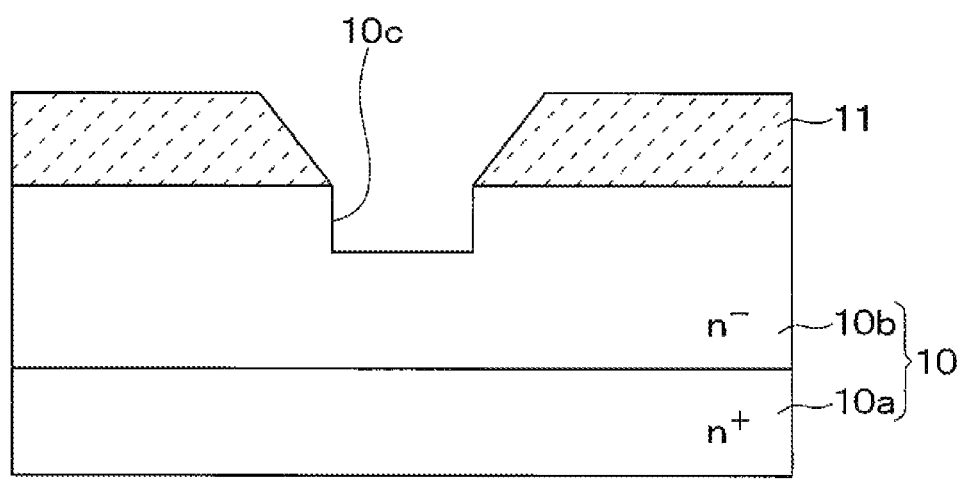
FIG. 11 is a cross-sectional view illustrating a state of a trench when defocus occurs.

As a result, it is possible to suppress variation in line width such as the trench 10c, the ion implantation layer and the contact holes of the interlayer insulating film, and it is possible to form the semiconductor element that can be adapted in miniaturization. In other words, in a situation where the defocus does not occur, the tilt of the side surface at a portion of the resist 11 opened by light exposure becomes steeper, as illustrated in FIG. 10. In other words, in a situation where the defocus occurs, the tilt of the side surface at a portion of the resist 11 opened by light exposure becomes gentle, as illustrated in FIG. 11. For example, the width at a time of forming the trench 10c varies, and the element characteristics varies. Thus, it is difficult to be adapted in miniaturization. In particular, the minimum processing dimension for the configuration element of the semiconductor element is 0.3 μm to 0.8 μm, for example, 0.5 μm or less. As the minimum processing dimension is narrower, the influence of the defocus becomes larger.

As described in the present embodiment, it is possible to suppress the defocus caused by the "waviness" of the surface of the SiC wafer by satisfying the condition of the "waviness value"≤1 μm for the semiconductor wafer 10. The fine exposure process can be stably performed. It is possible to manufacture a finer semiconductor element having the minimum processing dimension of 0.3 μm to 0.8 μm with higher precision.

Figure 12:
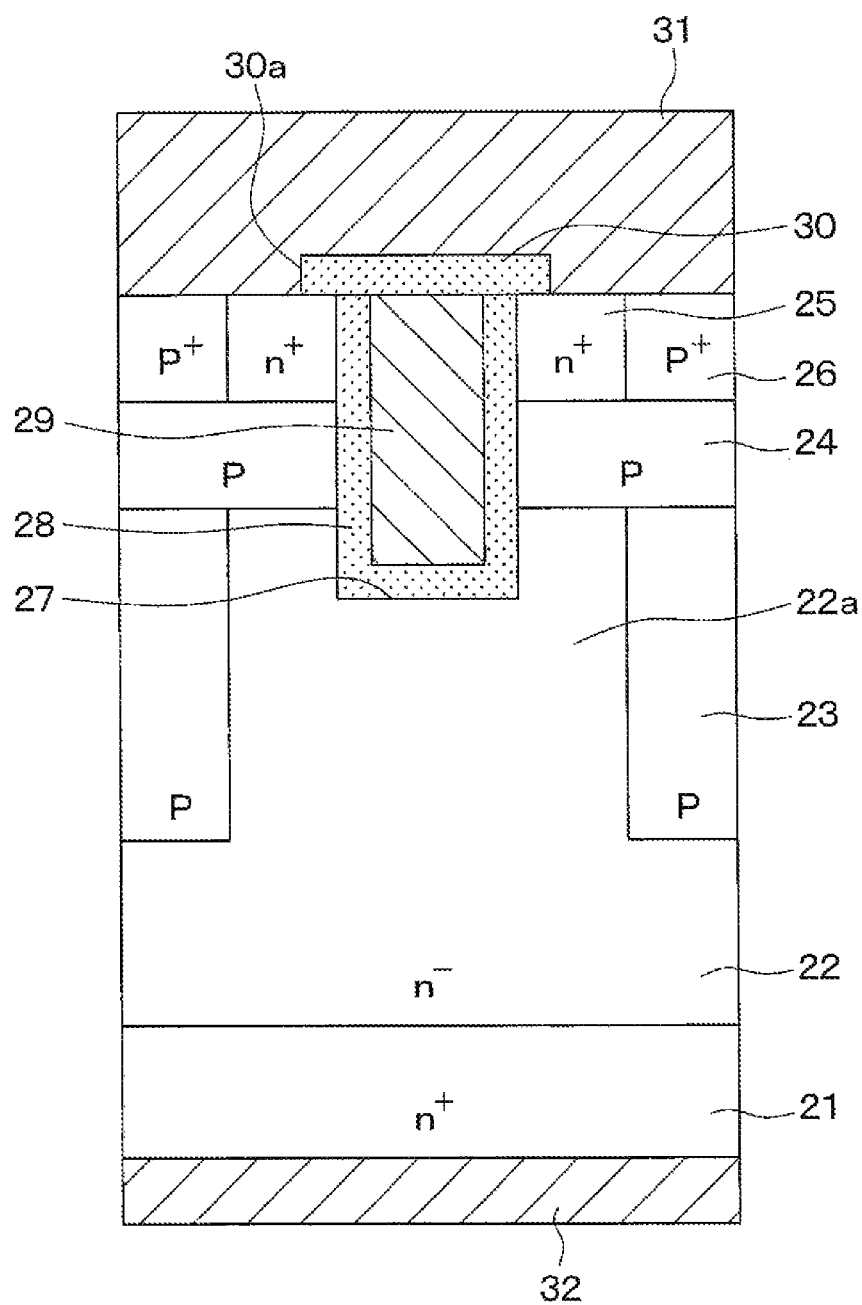
FIG. 12 is a cross-sectional view of a vertical MOSFET as an example of a semiconductor element formed in a SiC semiconductor device.

For example, as a method for manufacturing a SiC semiconductor device having a vertical MOSFET as illustrated in FIG. 12, the semiconductor wafer 10 satisfying the condition of the "waviness value"≤1 μm may be adopted. The SiC semiconductor device is formed with the use of a semiconductor substrate in which an n$^-$-type lower concentration layer 22 made of SiC having an impurity concentration lower than that of an n$^+$-type substrate 21 is epitaxially grown on a front surface of an n$^+$-type substrate 21 configuring a high-concentration impurity layer made of SiC. The n$^-$-type lower concentration layer 22 corresponds to the epilayer 10b. The n$^+$-type substrate 21 corresponds to the SiC wafer 10a. The n$^-$-type lower concentration layer 22 formed on the n$^+$-type substrate 21 corresponds to the semiconductor wafer 10. Therefore, the surface of the n$^-$-type lower concentration layer 22 is required to satisfy the condition of the "waviness value"≤1 μm.

The n$^-$-type lower concentration layer 2 is connected to the JFET portion 22a formed with a narrow width at a position away from the n$^+$-type substrate 21. A p-type deep layer 23 made of SiC is formed at both sides of the JFET portion 22a. The p-type deep layer 23 has a thickness similar to the thickness of the JFET portion 22a. A p-type base region 24 made of SiC is formed on the JFET portion 22a and the p-type deep layer 23. An n$^+$-type source region 25 and a p$^+$-type contact region 26 made of SiC are formed on the p-type base region 24. The n$^+$ type source region 25 is formed on a portion corresponding to the JFET portion 22a in the p type base region 24. The p$^+$ type contact region 26 is formed on a portion corresponding to the p type deep layer 23 in the p-type base region 24.

A gate trench 27 that penetrates the p-type source region 24 and the n$^+$ type source region 25 and reaches the JFET portion 22a is formed. The p-type base region 24 and the n$^+$-type source region 25 are disposed so as to be in contact with side surfaces of the gate trenches 27. The gate trench 27 is provided in a linear layout with a right and left direction of the paper of FIG. 12 as a width direction, a normal direction to the paper of FIG. 12 as a longitudinal direction, and an upper and lower direction of the paper as a depth direction. In addition, although only one gate trench 27 is shown in FIG. 12, multiple gate trenches 27 are disposed at regular intervals in the left and right directions of the paper so as to be sandwiched between the p-type deep layers 23, and formed in a stripe shape.

A gate insulating film 28 is formed on an inner wall surface of the gate trench 27 including a channel region. The channel region is a portion of the p type base region 24 located on a side surface of the gate trench 27 and, is a channel region connecting the n$^+$ type source region 25 and the JFET portion 22a when the vertical MOSFET is operated. A gate electrode 29 made of doped Poly-Si is formed on a surface of the gate insulating film 28, and the gate trench 27 is filled with the gate insulating film 28 and the gate electrode 29. As a result, a trench gate structure is formed.

An interlayer insulating film 30 is formed on the respective surfaces of n$^+$ type source region 25, the p$^+$ type contact region 26, and a trench gate structure. Further, on the interlayer insulating film 30, a source electrode 41 and a gate wiring layer (not shown) are formed. A contact hole 30a is formed at the interlayer insulating film 30, and a source electrode 31 is electrically connected to the n$^+$ type source region 25 or the p$^+$ type contact region 26. The gate wire is electrically connected to the gate electrode 23 through the contact hole provided in the interlayer insulating film 30 in a cross section different from that of FIG. 12.

Further, a drain electrode 32 electrically connected to the n$^+$-type substrate 21 is formed on a rear surface of the n$^+$-type substrate 21. Such a structure configures a vertical MOSFET of an n-channel type inverted trench gate structure. A cell region is formed by placing the vertical MOSFET cells described above. The SiC semiconductor device is configured by providing an outer peripheral withstand voltage structure by a guard ring (not shown) or the like so as to surround a cell region in which such a vertical MOSFET is formed.

In such a SiC semiconductor device, a portion of each impurity layer or the gate trench 27 having the minimum processing dimension, for example, the width of the gate trench 27 is set to 0.3 μm to 0.8 μm. In such a case, it is possible to manufacture the SiC semiconductor device with higher precision by using the semiconductor satisfying the condition of the "waviness value"≤1 μm.

Other Embodiments

While the present disclosure has been described in accordance with the embodiment described above, the present disclosure is not limited to the embodiment and includes various modifications and equivalent modifications. Furthermore, various combinations and aspects, and other combination and aspect including only one element, more than one element or less than one element, are also within the sprit and scope of the present disclosure.

For example, the above embodiment describes a vertical MOSFET as an example of the semiconductor element formed with the use of the semiconductor wafer 10 in which the epilayer 10b is formed on the SiC wafer 10a. Other devices such as a Schottky diode may also be used.

The numerical values mentioned in each of the above embodiments, for example, specific dimensions of the evaluation area, the light exposure area and the focus measurement range are merely described as an example. Other numerical values may also be used. In other words, in a situation where the dimension of the focus measurement range and the dimension of the light exposure area are different, these dimensions are arbitrary as long as the flatness is evaluated with the use of the "waviness value". Contrary to the example described in the above embodiment, the light exposure area may be wider than the focus measurement range.

What is claimed is:
1. A semiconductor wafer comprising:
a silicon carbide wafer; and
an epitaxial layer disposed at a surface of the silicon carbide wafer and made of silicon carbide, wherein the semiconductor wafer satisfies a condition that a waviness value is equal to or smaller than 1 micrometer, wherein the waviness value is defined as flatness of a surface of the epitaxial layer acquired by a surface shape measurement device, such that the waviness value is a sum of an absolute value of a value α and an absolute value of a value β, wherein a highest height among respective heights of a plurality of points with reference to a surface reference plane within a light exposure area is denoted as the value α, and a lowest height among the respective heights of the points at the epitaxial layer with reference to the surface reference plane within the light exposure area is denoted as the value β, wherein the surface reference plane is acquired by the surface shape measurement device through:
  a measurement of the respective heights of the points within an evaluation area; and
  a calculation of a least squares method based on the respective heights, wherein the light exposure area is different from the evaluation area, and wherein a center position of the light exposure area is identical to a center position of the evaluation area, and a range of the light exposure area is different from a range of the evaluation area.

2. The semiconductor wafer according to claim 1,
wherein the light exposure area includes a plurality of light exposure areas,
wherein the silicon carbide wafer has an effective area and an ineffective area, which is excluded from the effective area,
wherein the ineffective area includes an outer edge region of the silicon carbide wafer having a width of 5 micrometers,
wherein the light exposure areas are set within the effective area, and
wherein ninety percent or more of the light exposure areas satisfy a condition of the waviness value being equal to or smaller than 1 micrometer.

3. A method for manufacturing a silicon carbide semiconductor device, comprising:
preparing a silicon carbide wafer;
growing epitaxially an epitaxial layer made of silicon carbide at a surface of the silicon carbide wafer to form a semiconductor wafer;
evaluating flatness of a surface of the epitaxial layer with a surface shape measurement device setting an evaluation area and a light exposure area for the surface of the epitaxial layer,
  wherein a center position of the light exposure area is identical to a center position of the evaluation area, and
  wherein a range of the light exposure area is different from a range of the evaluation area; and
forming a semiconductor element by adopting the semiconductor wafer after evaluating the flatness of the surface of the epitaxial layer,
wherein, in evaluating the flatness of the surface of the epitaxial layer, the surface shape measurement device
  measures respective heights of a plurality of points at the epitaxial layer within the evaluation area,
  determines a surface reference plane for the epitaxial layer through a calculation of a least-squares method based on the measured respective heights of the points within the evaluation area, and
  evaluates a waviness value within the light exposure area,
wherein the semiconductor wafer is adopted, in a condition that the waviness value is equal to or smaller than 1 micrometer,
wherein the waviness value is a sum of an absolute value of a value α and an absolute value of a value β, and
wherein a highest height among the measured respective heights with reference to the surface reference plane within the light exposure area is denoted as the value α, and a lowest height among the respective heights with reference to the surface reference plane within the light exposure area is denoted as the value β.

4. The method according to claim 3,
wherein the light exposure area includes a plurality of light exposure areas,
wherein the silicon carbide wafer includes an effective area and an ineffective area, which is excluded from the effective area,
wherein the ineffective area includes an outer edge region of the silicon carbide wafer having a width of 5 micrometers,
wherein the light exposure areas are set within the effective area, and
wherein, in evaluating the flatness of the surface, the semiconductor wafer is adopted in a condition that ninety percent or more of the light exposure areas have the waviness value being equal to or smaller than 1 micrometer.

5. The method according to claim 3,
wherein, in forming the semiconductor element, a minimum processing dimension for an element included in the semiconductor element is set to 0.3 micrometers to 0.8 micrometers.

6. The method according to claim 3,
wherein, in forming the semiconductor element, a vertical MOSFET is formed as the semiconductor element.

* * * * *